United States Patent
Chen

[11] Patent Number: 6,028,545
[45] Date of Patent: Feb. 22, 2000

[54] MUTI-BIT SUCCESSIVE-APPROXIMATION ANALOG-TO-DIGITAL CONVERTER WITH IMPROVED CONVERSION SPEED

[75] Inventor: Chieh-Hung Chen, Kao-Hsiung, Taiwan

[73] Assignee: Industrial Technology Research Institute, Taiwan

[21] Appl. No.: 08/997,307

[22] Filed: Dec. 23, 1997

[51] Int. Cl.[7] .................................................. H03M 1/12
[52] U.S. Cl. .......................... 341/156; 341/164; 341/165
[58] Field of Search .................................... 341/156, 164, 341/165

[56] References Cited

U.S. PATENT DOCUMENTS

| | | | |
|---|---|---|---|
| 4,870,416 | 9/1989 | Mapleston | 341/110 |
| 4,875,048 | 10/1989 | Shimizu et al. | 341/156 |
| 4,912,470 | 3/1990 | Hosotani et al. | 341/156 |
| 5,248,973 | 9/1993 | Babu et al. | 341/156 |
| 5,353,027 | 10/1994 | Vorenkamp et al. | 341/156 |
| 5,394,148 | 2/1995 | Matsuura et al. | 341/162 |
| 5,459,465 | 10/1995 | Kagey | 341/156 |
| 5,696,510 | 12/1997 | Paillardet et al. | 341/156 |
| 5,870,042 | 2/1999 | Noda | 341/120 |

Primary Examiner—Michael Tokar
Assistant Examiner—Jason L W Kost
Attorney, Agent, or Firm—Smith, Gambrell & Russell, LLP

[57] ABSTRACT

The subject invention relates to a type of multi-bits successive-approximation ADC to convert analog signals into a N-bits digital output code, wherein N is the number of bits of output code. The ADC includes (a) an input sample/hold circuit that takes the sample of analog input signals during the first half of clock cycle, and maintains the analog input signals after the sampling and during a conversion process. The ADC also includes (b) a reference voltage generator, to produce different reference voltages, (c) CLOCK pulse generation circuitry to continuously produce CLOCK pulse signals, (d) several comparators for comparison of the sampled input signals with a rough reference voltage to produce a rough digital output code. The ADC applies a temperature scale to roughly estimate the sampled analog input signals, this to be completed in a second half of the CLOCK cycle. The ADC further includes (e) a digital thermometer decoder producing a signal output of N bits, and (f) and output code data recording device to provide the output of complete signal data after conversion has been completed.

5 Claims, 16 Drawing Sheets

MUTI-BIT SUCCESSIVE-APPROXIMATION ANALOG-TO-DIGITAL CONVERTER WITH IMPROVED CONVERSION SPEED

BACKGROUND OF THE INVENTION

The subject invention relates to a type of multi-bits successive approximation analog/digital converter, to convert analog signals into a digital output code of N-bits, so the application os its frequency range can be upgraded significantly, up to several MHz or more, for utilization in VIDEO application. The weakness of frequency range the prior art of single-bit successive approximation ADC can be improved, and its scope of applications can be expanded to more fields.

DESCRIPTION OF PRIOR ART

Conventionally, in a prior art successive approximation ADC, each and every bit is compared one by one, so its conversion speed is limited to a maximum of several dozens of kHz to several hundreds of kHz and applied to only an AUDIO field. In the case of video applications, it could not achieve the function; its conversion speed could not be improved since it employs this bit comparison and conversion technology.

In view of said weakness in prior art analog/digital converters, the subject inventor has devoted intensive study for possible improvement and has finally accomplished the subject invention.

SUMMARY OF THE INVENTION

Therefore, the primary purpose of the subject invention is to provide a type of multi-bits successive approximation ADC that may increase the conversion rate, especially for video applications.

Another purpose of the subject invention is to provide a type of multi-purpose ADC with improved conversion speed, for applications upgraded to VIDEO fields, without reducing resolution.

To achieve said purposes, several comparators are used, so that said multi-bits successive approximation ADC will produce multi-bits in a single CLOCK pulse. This reduces the number of clock cycles required for the conversion, while changing conversion speed, so that the conversion frequency is upgraded to several MHz, while maintaining the comparators' bit-by-bit comparison mechanism and while including three different modes, namely an I/P sample, a DA predict and a DA decision, and the VIN digital code. Meanwhile, by means of a capacitor coupling technique, the comparators will extend the resolution of the multi-bits successive-approximation ADC. Furthermore, the array of the SUB-DAC and the capacitor at the input of the comparator may be designed, by using different ratios, to minimize the difference between the reference voltages used by the SUB-DAC and another main DAC.

As for the detailed implementation, applied principles, functions and performance, etc., please refer to the following drawings and description.

11 Digital/Analog Converter 1, providing reference voltage signal,
DAC1i(i=1,2, ... $2^M-1$) and DAC1X 12 Digital/Analog Converter 2, providing reference voltage signal,
DAC2i(i=1,2, ... $2^M-1$) and DAC2X 13 Digital/Analog Converter j, providing reference voltage signal,
DACji(i=1,2, ... $2^M-1$) and DACjX 14 Digital/Analog Converter N, providing reference voltage signal,
DACNi(i=1, 2, ... $2^M-1$) and DACNX 15 Comparator 16 Thermometer Decoder 17 Output code data recording device.

Figure 2:
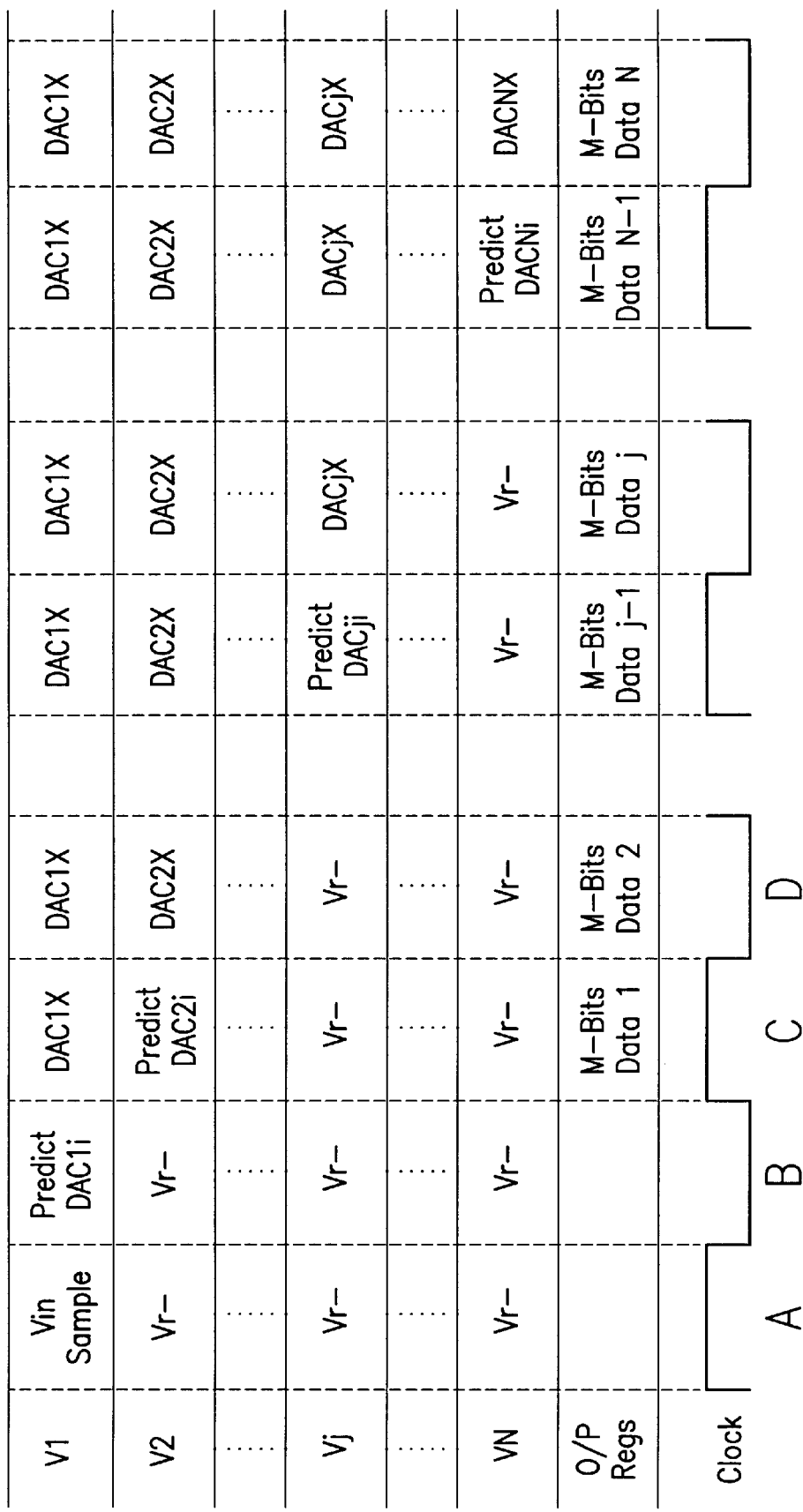

FIG. 2 is a time sequence diagram of the subject invention.

Figure 3:
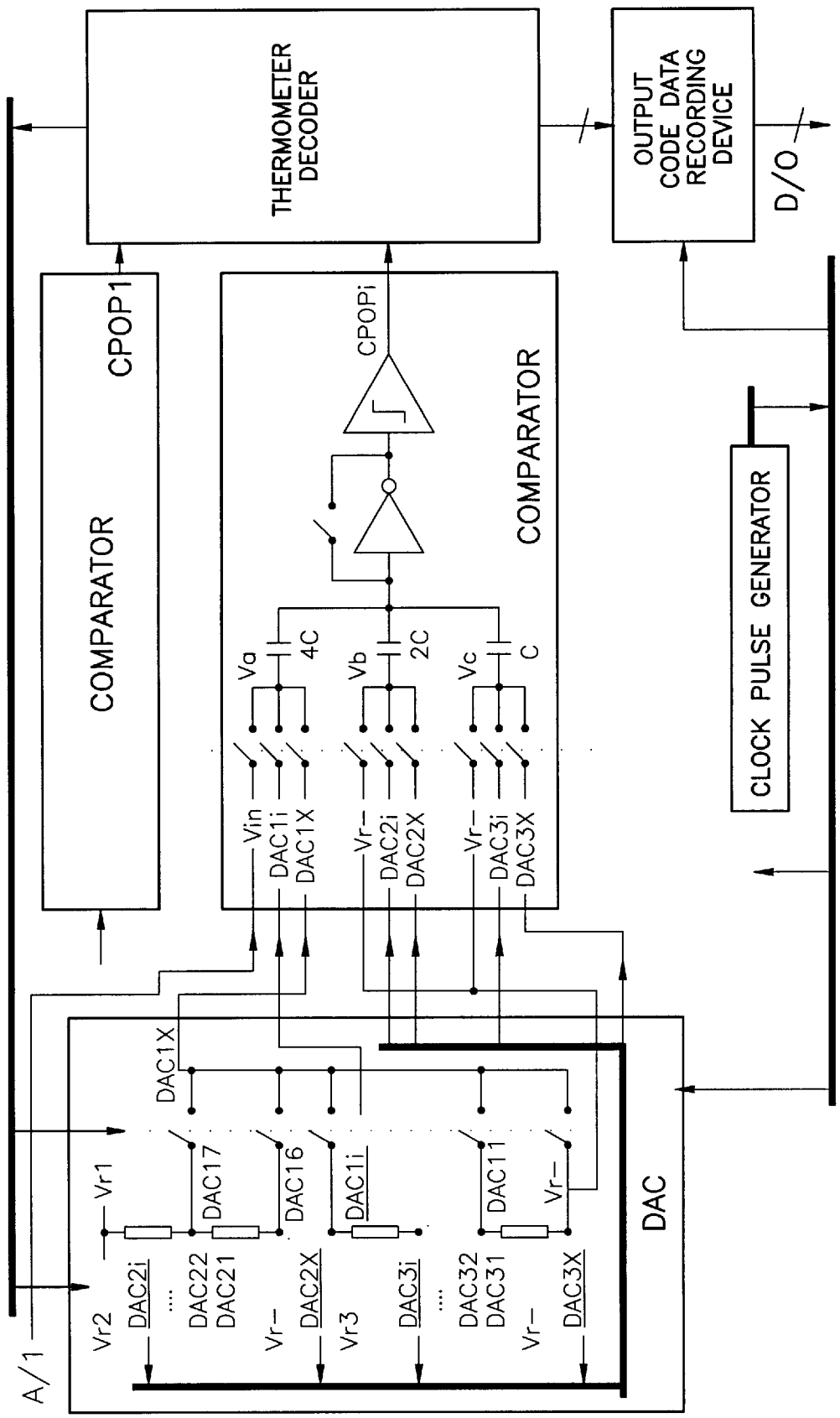

FIG. 3 is an embodiment of the subject invention with 9-Bits signal processing.

Figure 4:
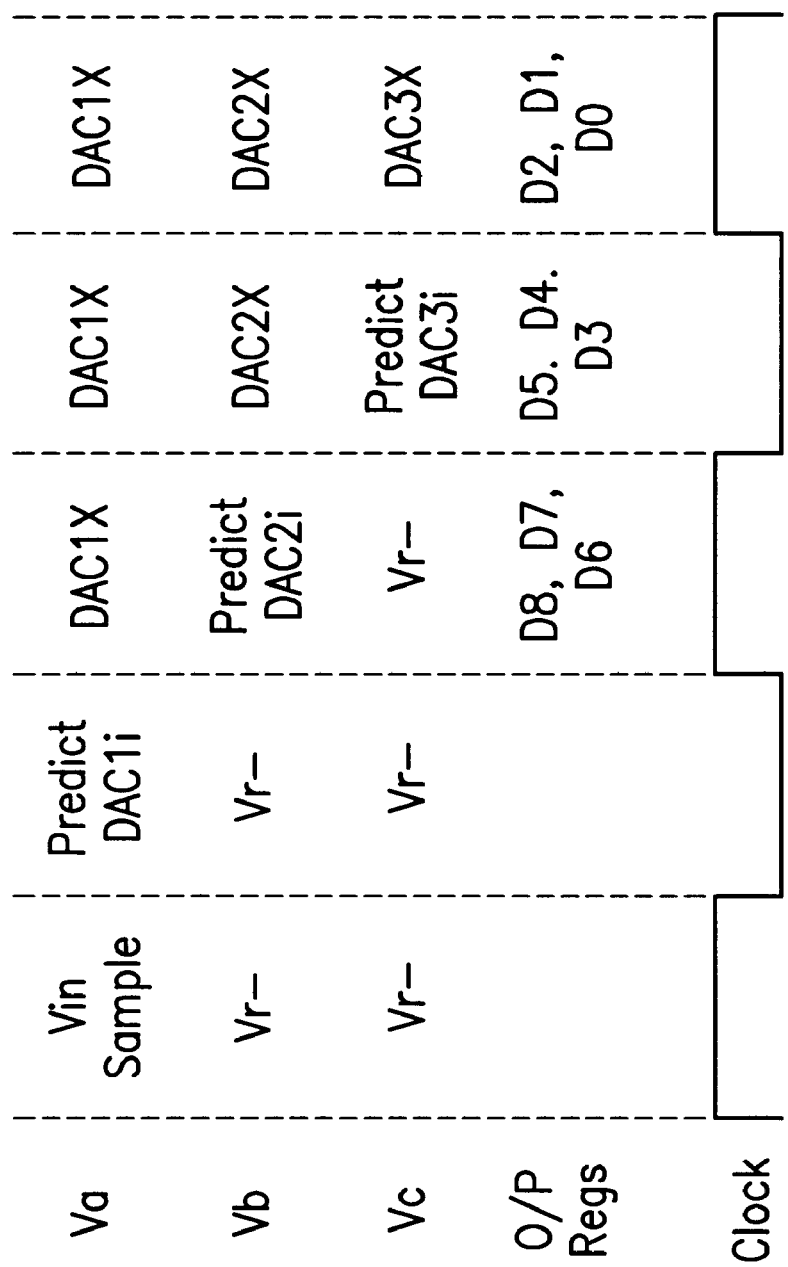

FIG. 4 is a time sequence diagram of the subject invention in the 9-Bits embodiment.

Figure 5:
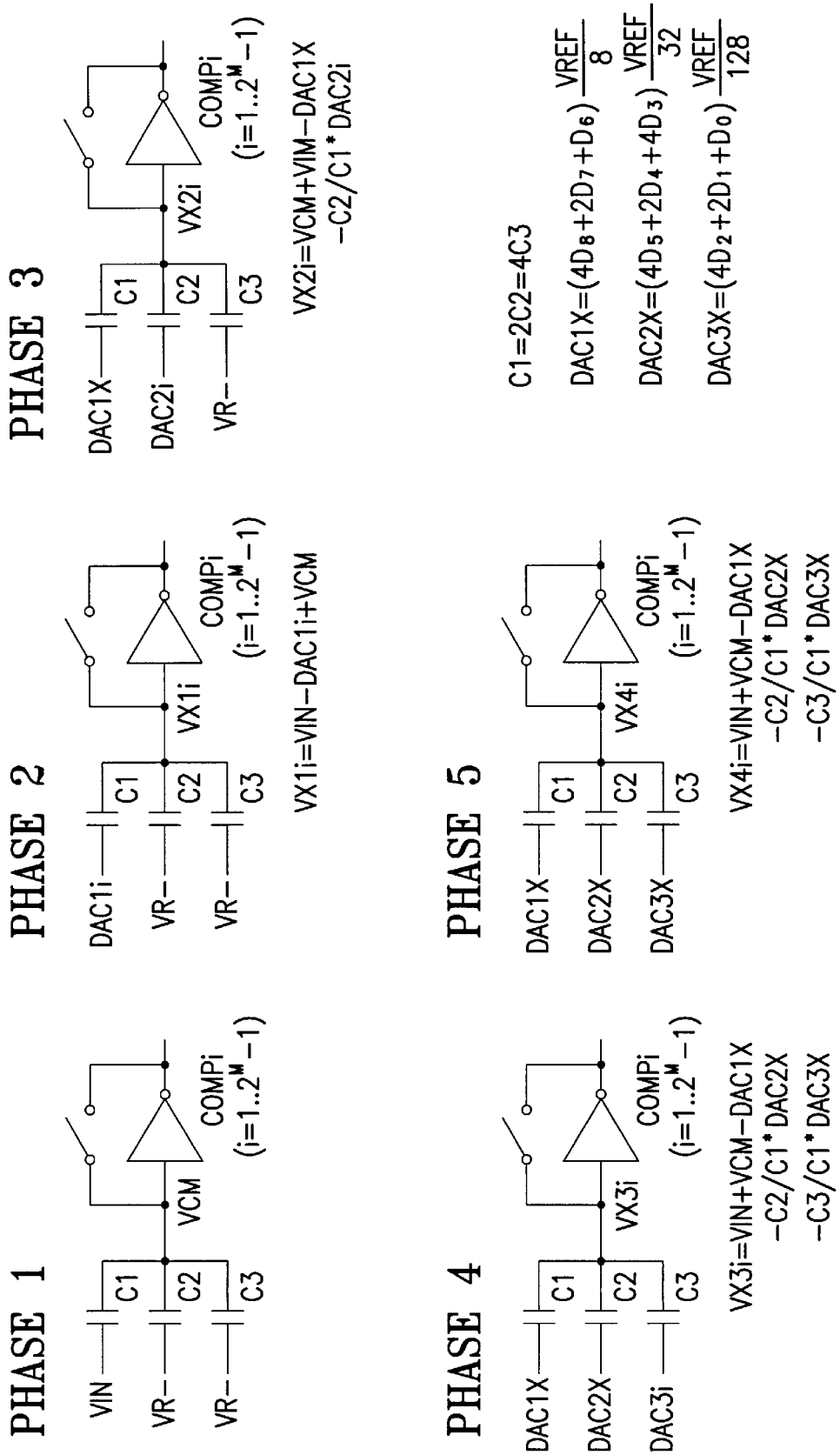

FIG. 5 is a relationship diagram of the subject invention with the 9-Bits embodiment in action.

Figures 1, 6:
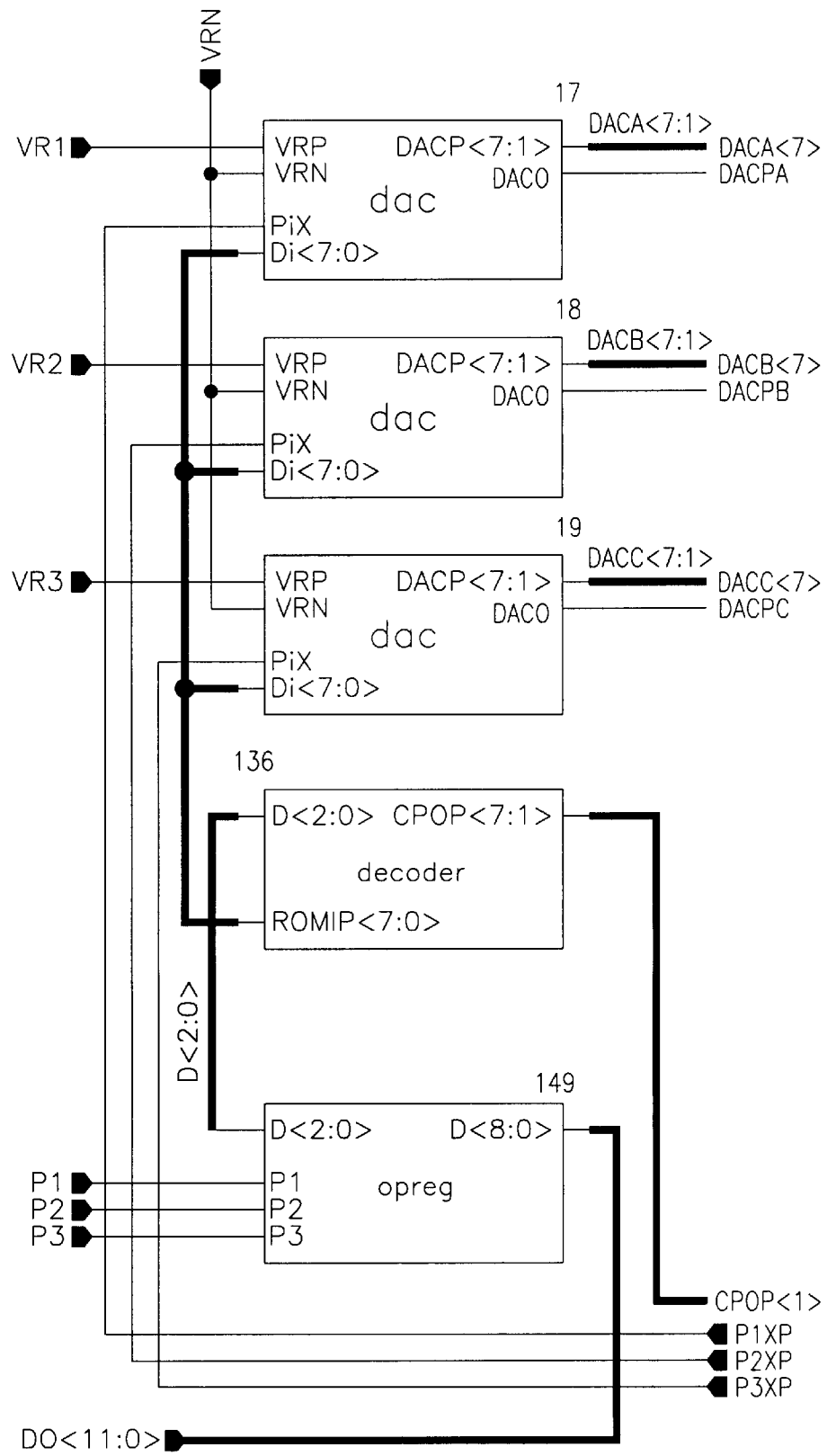
Figures 2, 6:
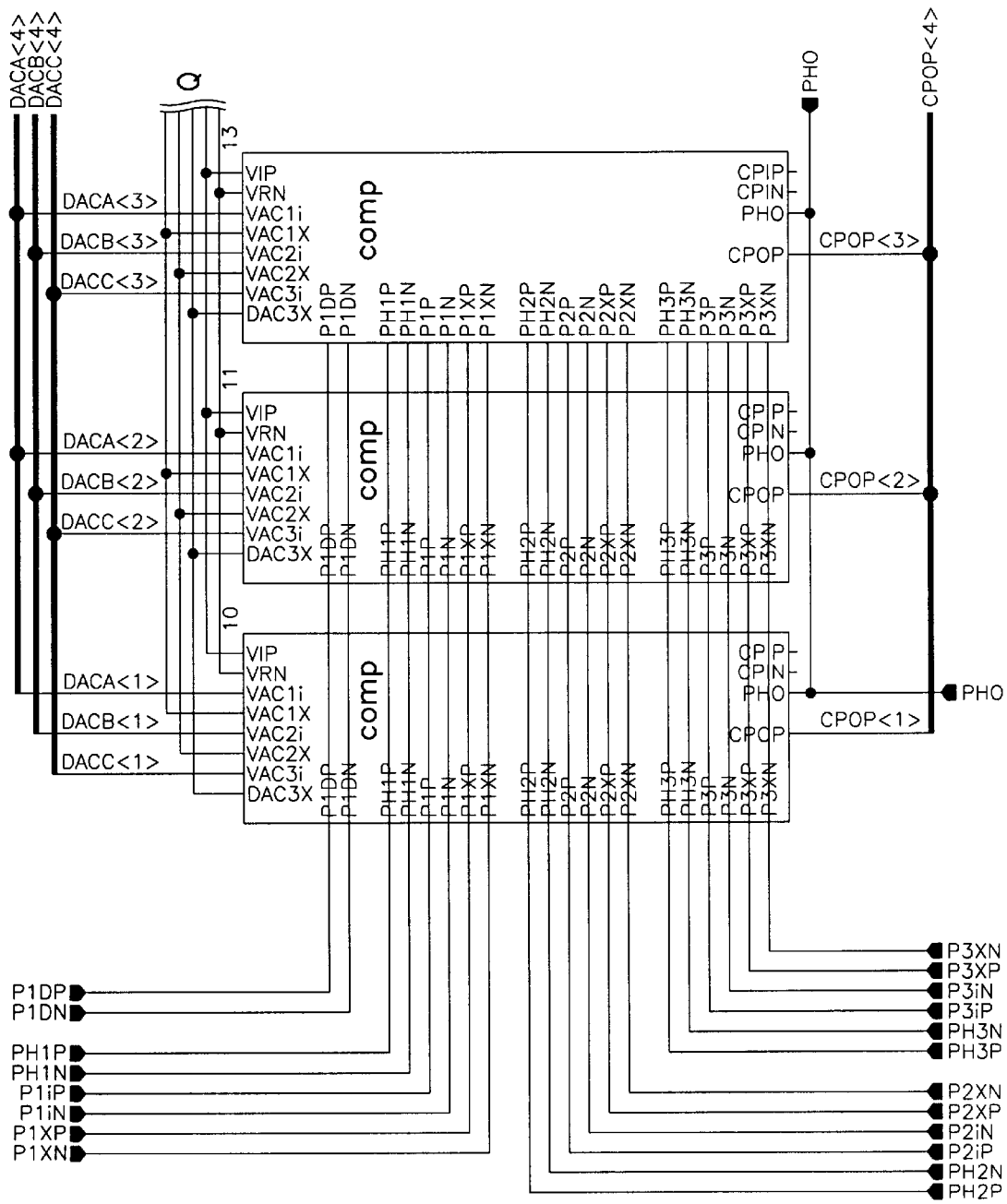
Figures 3, 6:
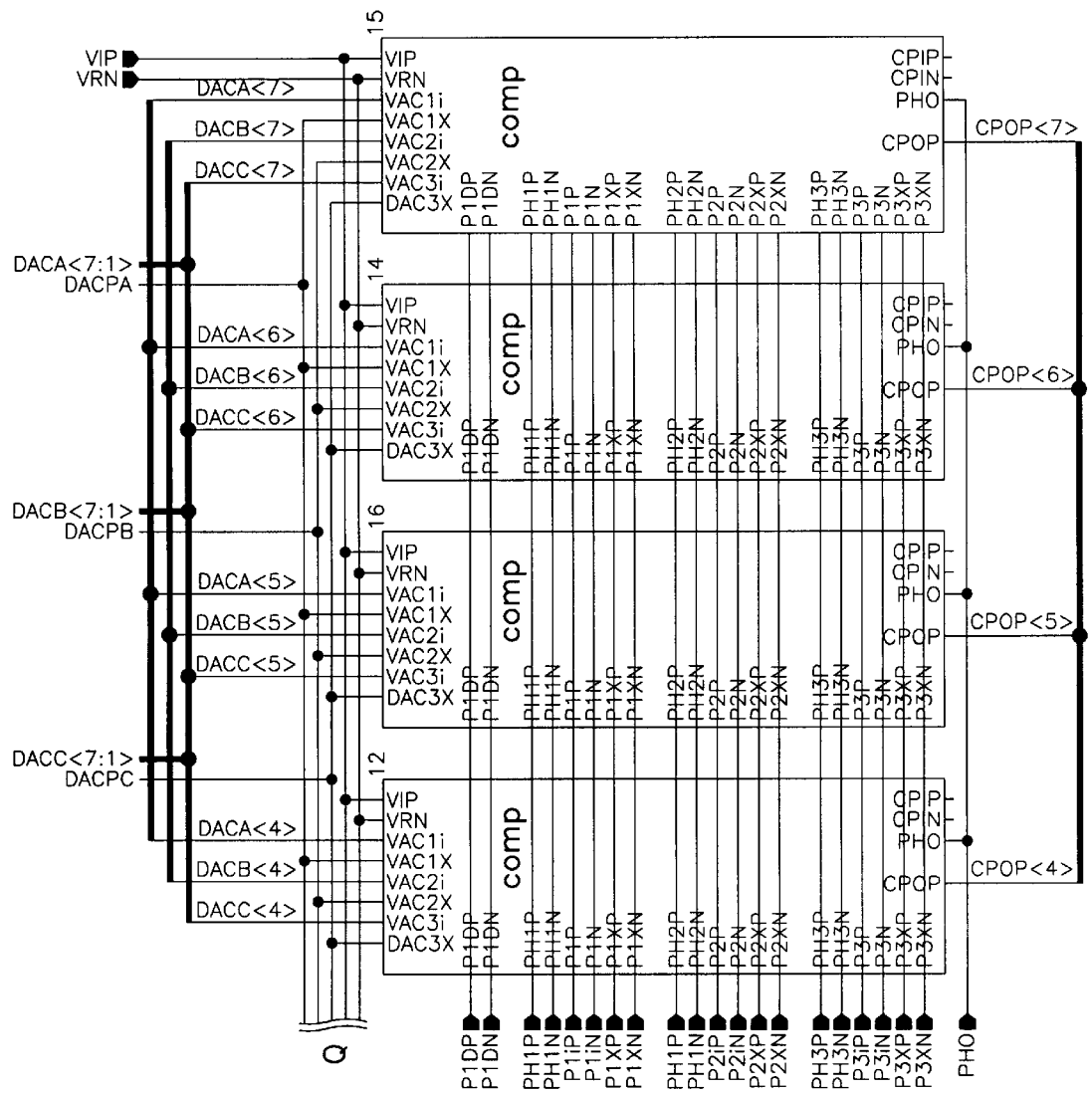

FIG. 6 is a wiring diagram (5-1) of an implementable embodiment according to the subject invention.

Figures 1, 7:
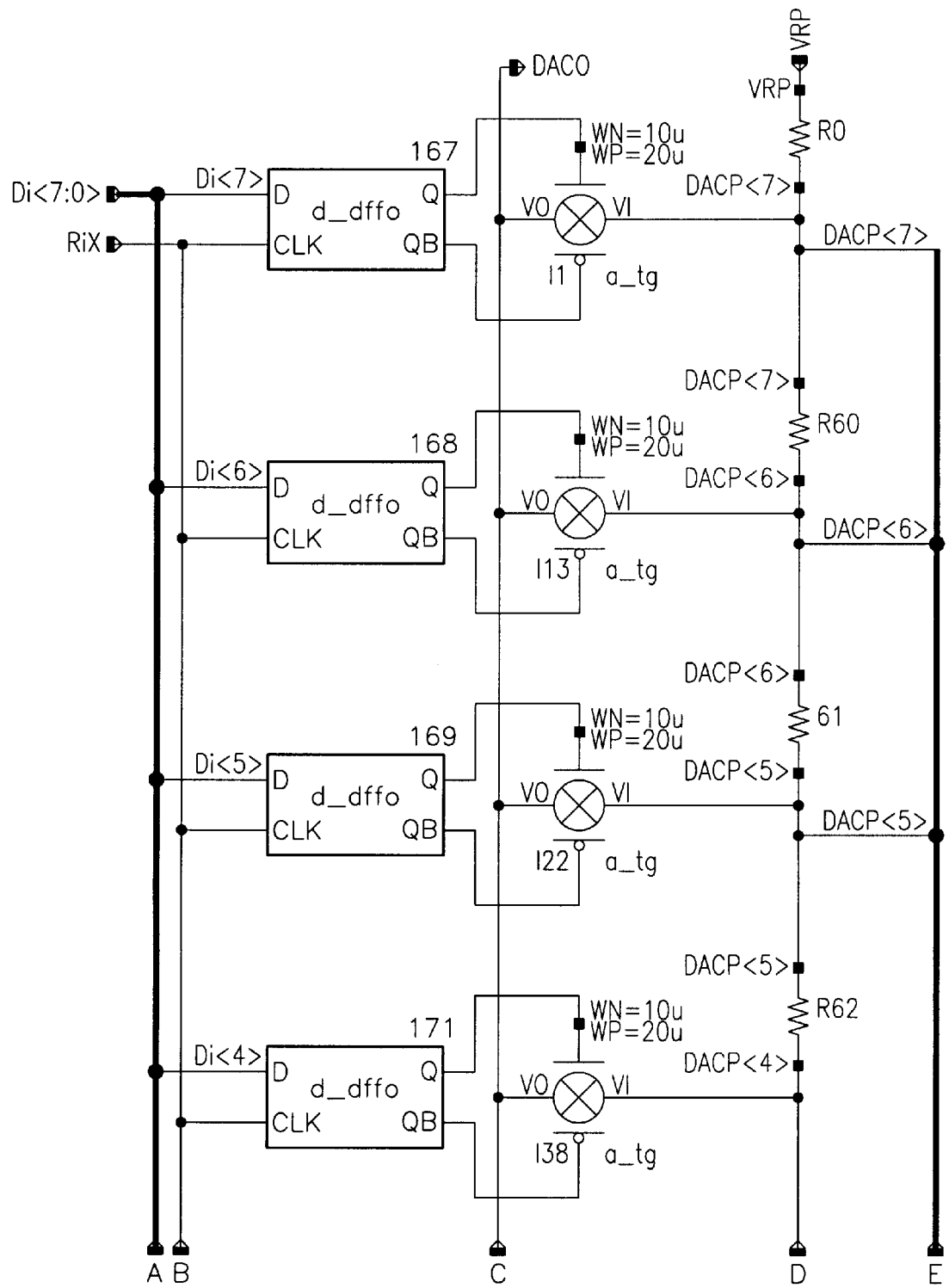
Figures 2, 7:
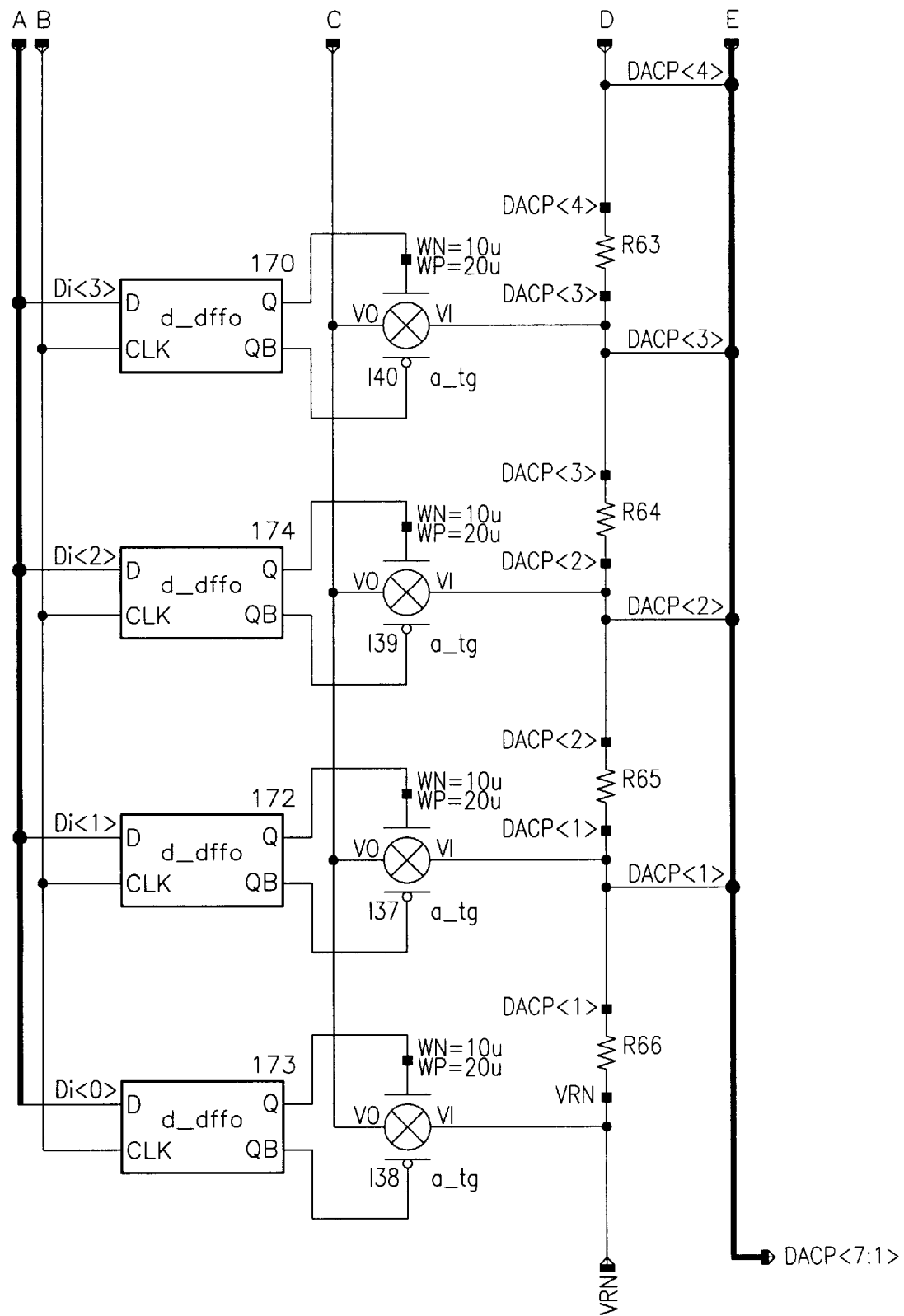

FIG. 7 is a wiring diagram (5-2) of an implementable embodiment according to the subject invention.

Figures 1, 8:
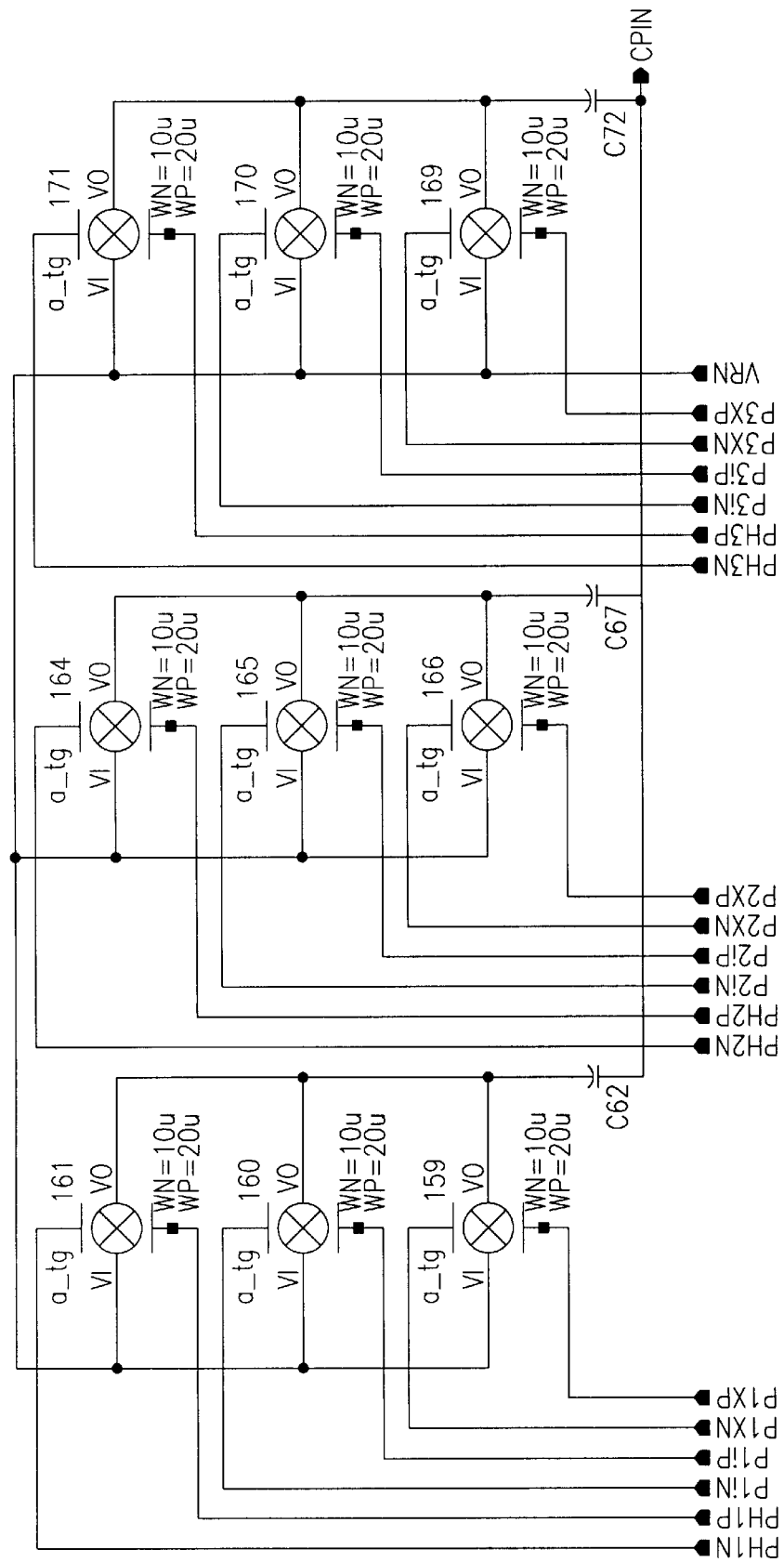
Figures 2, 8:
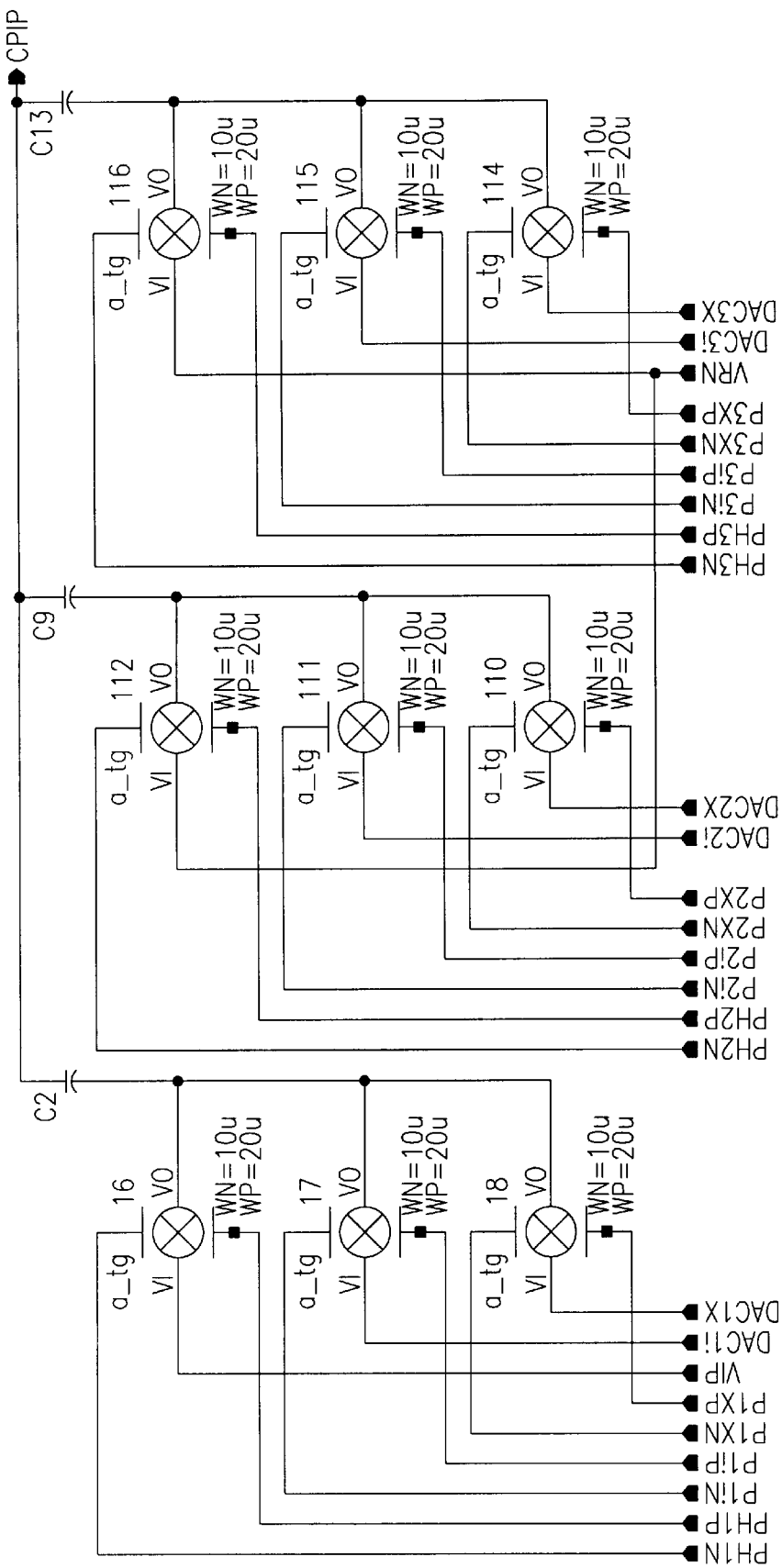
Figures 3, 8:
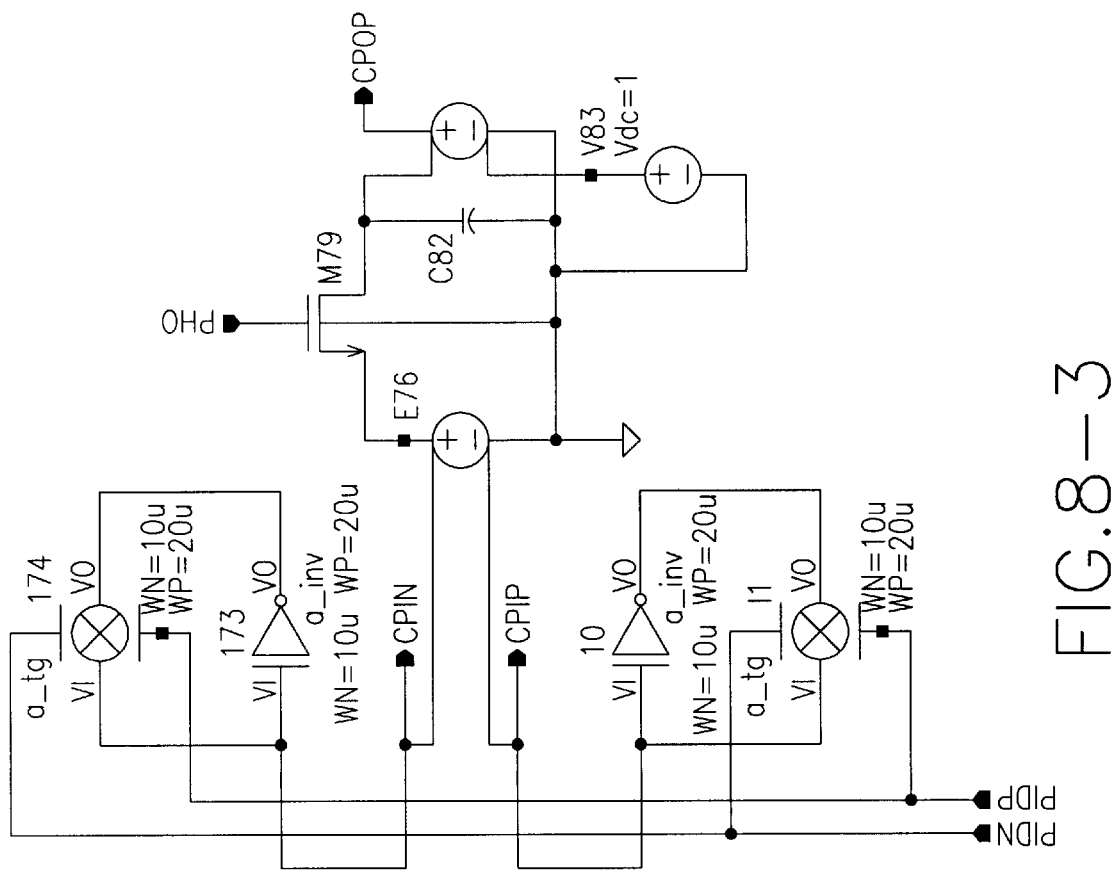

FIG. 8 is a wiring diagram (5-3) of an implementable embodiment according to the subject invention.

Figures 1, 9:
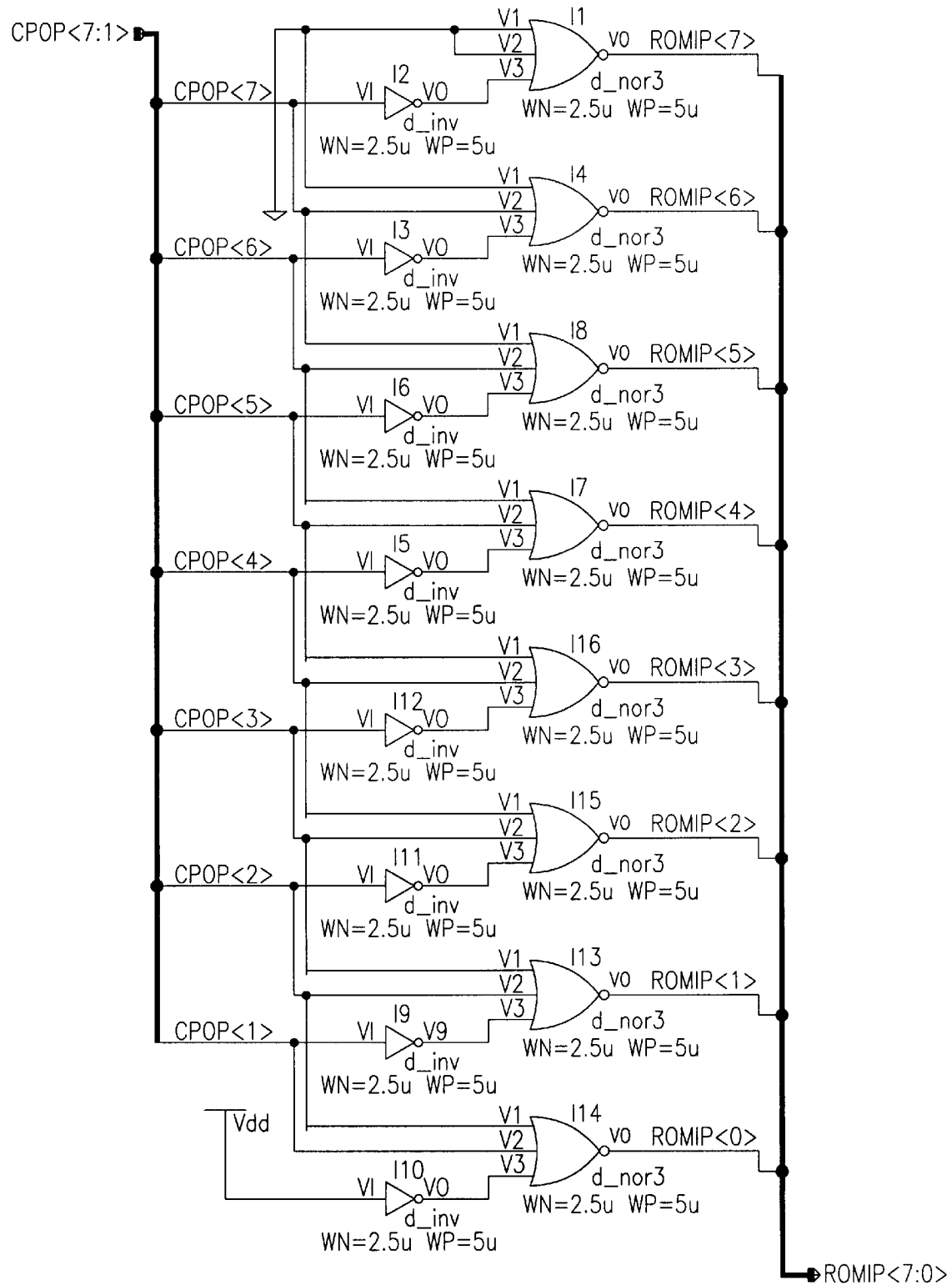
Figures 2, 9:
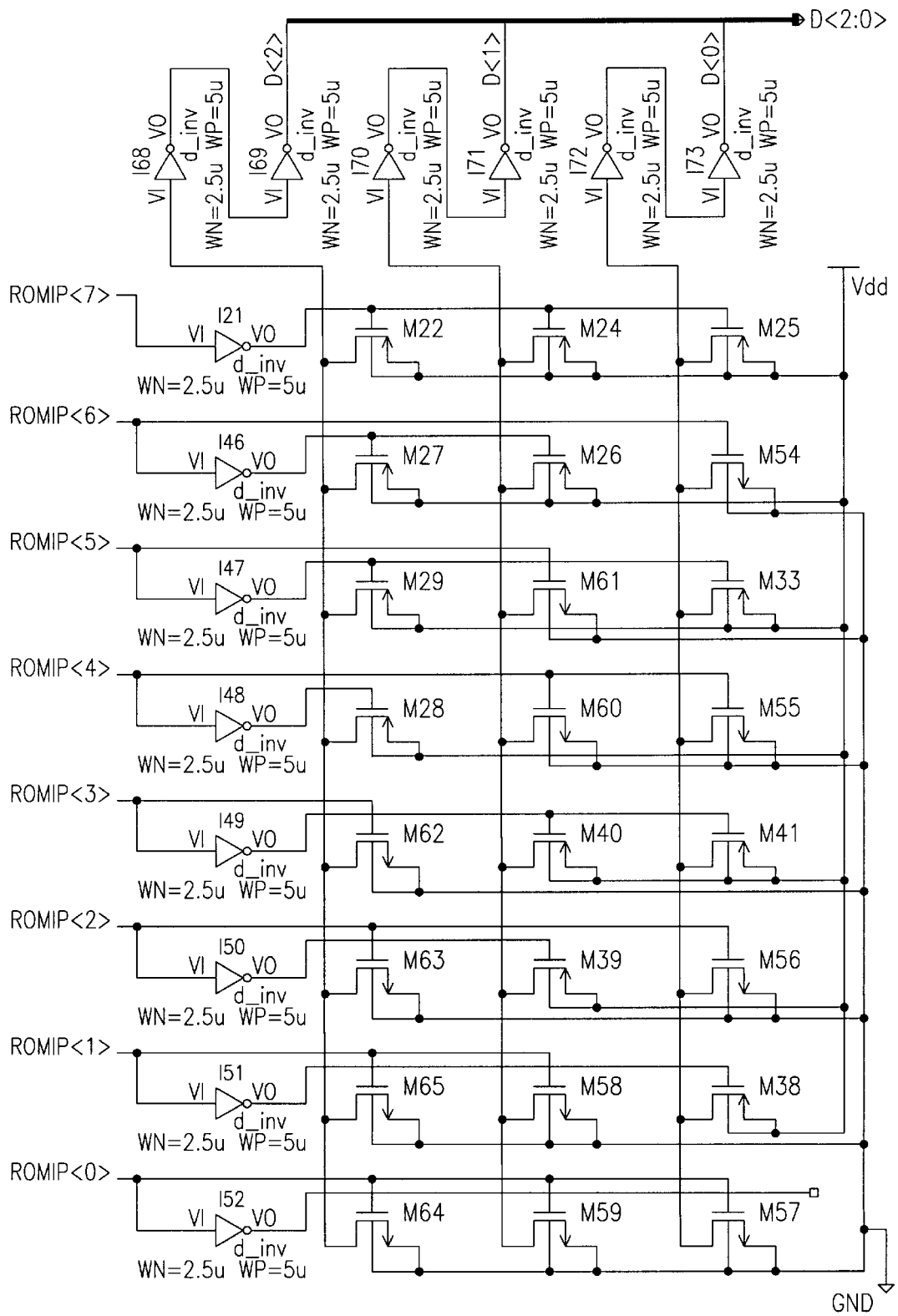

FIG. 9 is a wiring diagram (5-4) of an implementable embodiment according to the subject invention.

Figure 10:
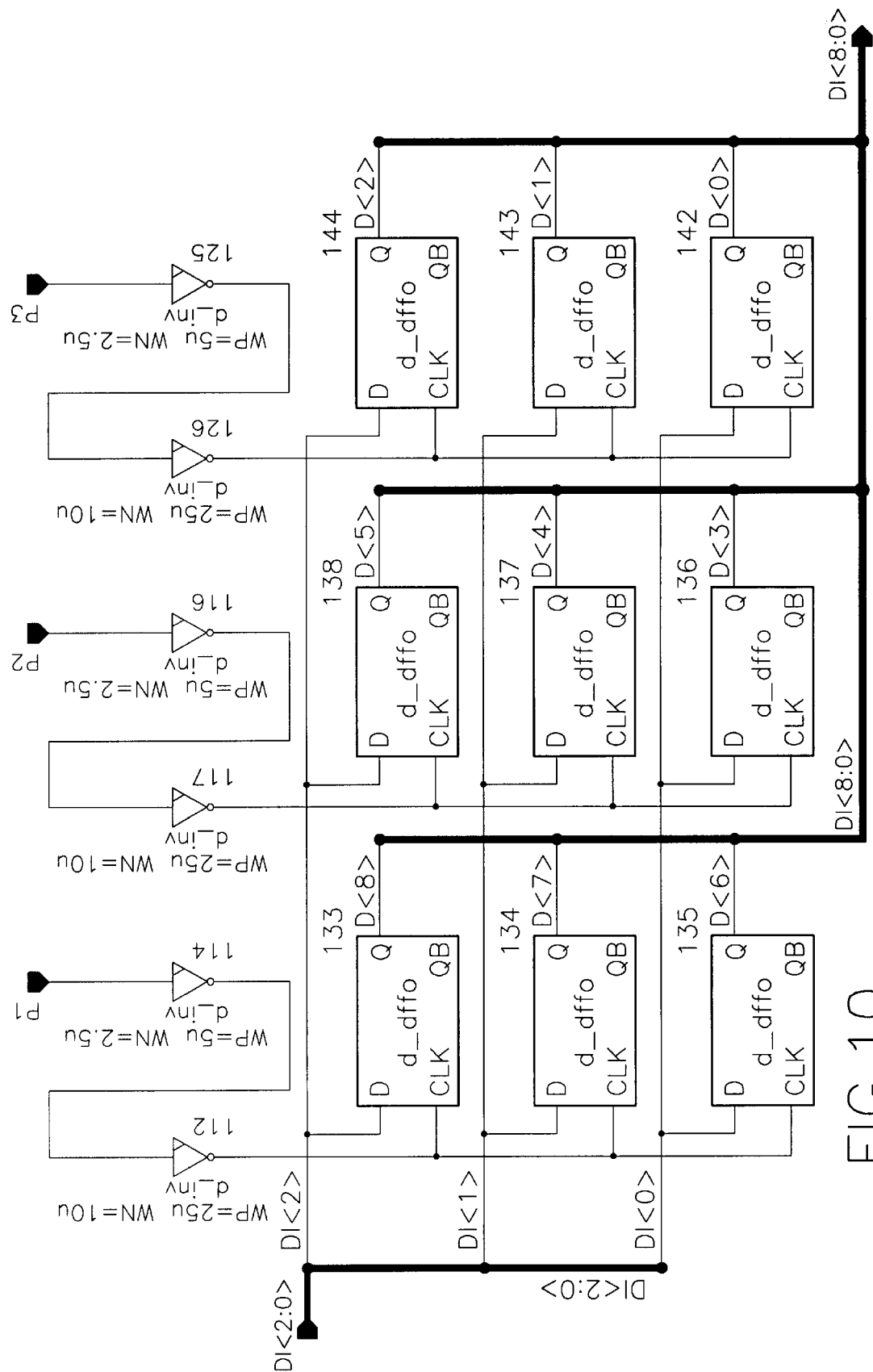

FIG. 10 is a wiring diagram (5-5) of an implementable embodiment according to the subject invention.

DETAILED DESCRIPTION OF PREFERRED EMBODIMENT

Figure 1:
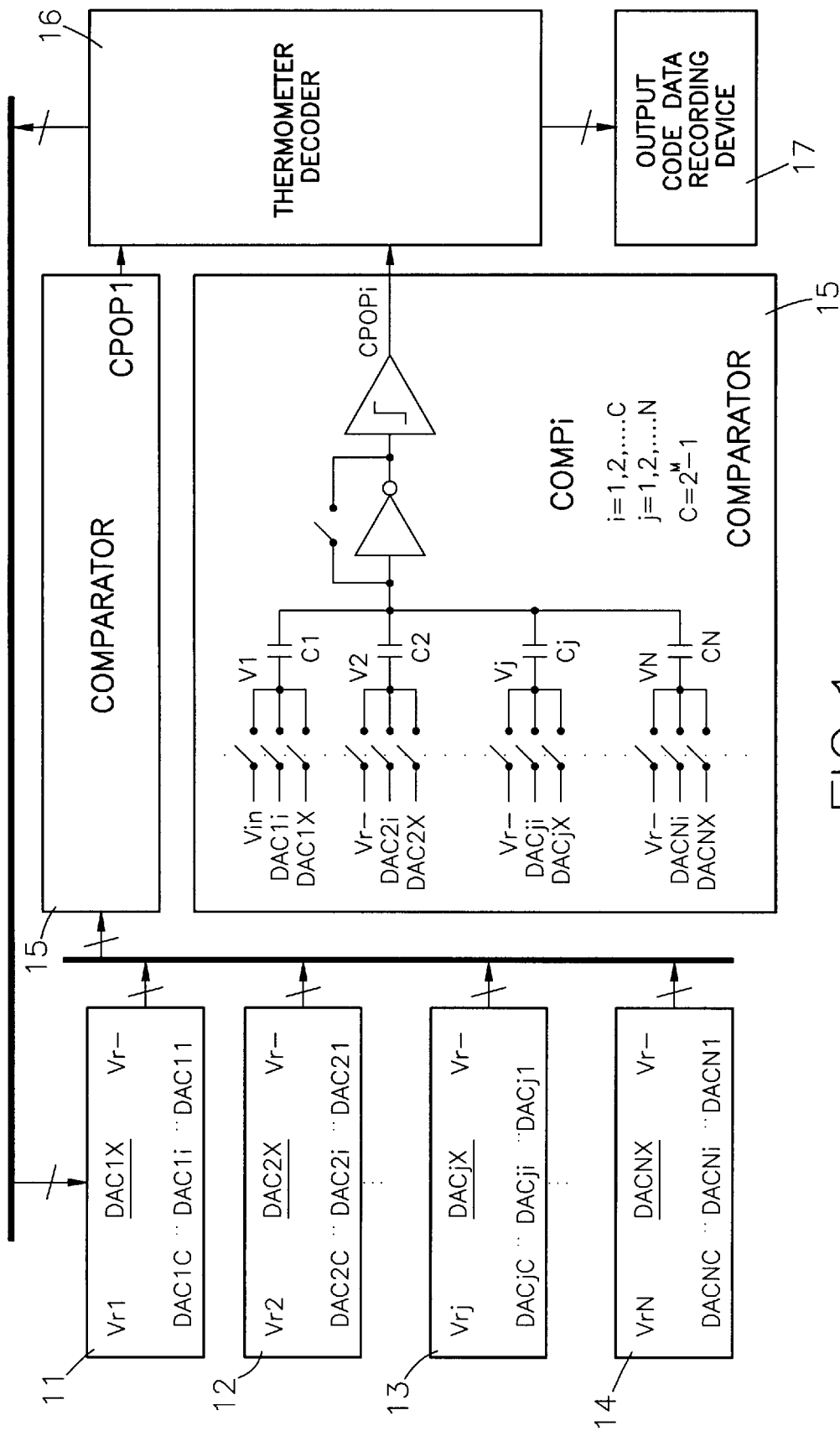
FIG. 1 is a block diagram of the subject invention, with the following associations.

Please refer to FIG. 1 which is the block diagram of the subject invention. Signals of different analog signals are transmitted to one end of a comparator by DAC1(11), DAC2(12), ... DACN(14). With several comparators (15), the signals of the comparators (15) are transmitted to the thermometer decoder (16). After decoding by thermometer decoder, M-Bits of address signals are delivered and supplied to the output data recording device (17). After all conversion is completed, the completed signals and data are sent out.

Referring to FIG. 2, this is a comparative diagram of time sequence including all capacitor sampling voltages of the subject invention, with all capacitor sampling voltages (V1, V2, ... Vj, ... VN), and a CLOCK pulse generator, and the signal wave forms of the data output recording device. Firstly, when at the first half of the first cycle of CLOCK PULSE signals (i.e. the A time section in the Fig.), the V1 of all comparators is in a sampling mode. Voltage V2 is a DC reference voltage (Vr−), and Vj and VN are also the same voltage. In the second half of the cycle (i.e. the B time section in the Fig.), V1 is in a predict mode. At this time, the predict voltage of all comparators in DAC1i(i=1 ... $2^M-1$). When the signals enter a second clock cycle (i.e. the C time section in the Fig.), the V1 voltage of all comparators is DAC1X. Voltage V2 is in a predict mode, the respective voltage is DAC2i(i=1 ... $2^M-1$), and the output data recording device (17) now sends out the first set of M-bits data, and sends out data 1 in first half cycle (C time section). In the second half cycle, it send out data 2 (D time section) and so on. It sends out the Nth set of data until Mth cycle and then the conversion of a total of M·N-bits data is accomplished.

Please refer to FIGS. 3 and 4 which is the time sequence diagram and the implementation of a 9-Bits analog-to-digital converter of the subject invention.

Please refer to FIG. 5 which is the relation diagram of the subject invention in action. Here for example, three bits are compared each time, for a total of three clock cycles, said DAC total bits is 9-Bits. When seven comparators are used, i.e. M=3, the number of comparators and the number of bits are related as follows. The number of comparators is $2^M-1$ (M: number of bits. In the case where $2^M-1$ comparators (31) are used, and each comparator uses the array composed of a number of N capacitors, then, the total number of bits of the subject invention is equal to M·N, and the required number of CLOCK pulses will be (N+2)/2. Therefore, the number of executed cycles is reduced, more comparators and a fewer capacitor array may be used to achieve the purpose of the subject invention that is upgrading of the frequency range in use to reach a high frequency of more than several MHz that may be applied in VIDEO applications.

In FIG. 5, it includes phase 1, phase 2, phase 3, phase 4 and phase 5.

In the case of phase 1, the comparators are in an Auto-zeroing mode, so, the voltage at the input point is VCM.

The relationship of the VX1i signal voltage and the input signal voltage is as follows:

VX1i=VIN−DAC1i+VCM, wherein VCM is the voltage at the VCM point of phase 1.

In phase 3, the VX2i=VCM+ViN−DAC1X−(C2/C1).DAC2i.

In phase 4, the VX3i=VCM+DAC1X−(C2/C1).DAC2X−(C3/C!).DAC2i.

In phase 5, the VXX4j=ViN+DAC1X−(C2/C1).DAC2X−(C3/C1).DAC3X.

Here C1=2C2=4C3,

DAC1X=(4D8+2D7−D6) VREF/8,

DAC2X=(4D5+2D4−4D3) VREF/32, and

DAC3X=(4D2+2D1−DO) VREF/128.

The comparator employs fully-differential structure, though only single-way signals. If one end receives a common-module voltage, it will still operate as for fully-differential operations.

Please refer to FIGS. 6, 7, 8, 9 and 10 which are wiring diagrams of an embodiment of subject invention.

In the application of traditional technology, data is compared bit by bit. If the number of bits is N, the number of CLOCK pulses required will be N at the least. So, the effective processing speed will restrict the applicable range. The range limit will be several dozens of kHz or hundreds of kHz. In the subject invention, several comparators are used, so that a multi-bits successive approximation ADC will produce several bits at a single CLOCK pulse, to reduce the number of CLOCK pulse cycles required for the conversion, to completely improve the conventional technology, and to extend the resolution by means of its capacitor coupling technique.

Summing up, the subject invention of multi-bits successive approximation ADC, with effective functions to decrease the frequency range and upgrade the resolution, and which will effectively improve the prior art, has not been disclosed for public use.

It is hereby declared that the above description, covering only the preferred embodiments of the subject invention, should not be used to unduly limit or restrict the subject claims.

I claim:

1. A multi-bits successive approximation ADC serving to convert analog input signals into a N-bit digital output code, the digital output code representing a parameter of the analog input signals, said ADC comprising:

(a) input sample/hold devices for sampling analog input signals during a first half of a clock cycle, and maintaining the analog input signals during a conversion process;

(b) a reference voltage generator serving to produce different reference voltages;

(c) a CLOCK pulse generation circuit for continuous generation of CLOCK pulse signals;

(d) several comparators for comparing the analog input signals and a rough reference voltage to produce a rough digital code during a second half of the clock cycle and based on a temperature scale serving to roughly estimate the sampled analog input signals;

(e) a digital thermometer decoder for producing a N-Bits output signal; and (f) an output code data recording device for providing a complete output of entire signal data.

2. The multi-bits successive-approximation ADC according to claim 1, wherein the number of comparators and the number of bits per iteration is $2^M-1$, and M is the number of bits.

3. The multi-bits successive-approximation ADC according to claim 2, wherein $2^M-1$ comparators are used, and each comparator uses an array composed of N parallel capacitors, a total bit number of o/p output data is given by the multiplication of M and N, and the required number of CLOCK cycles is given by (N+2)/2.

4. The multi-bits successive-approximation ADC according to claim 1, wherein the input sample hold circuit takes the sample before a time sequence cycle and maintains the sampling signals.

5. The multi-bits successive-approximation ADC according to claim 1, wherein the comparators employ a fully-differential strategy.

* * * * *